(12) United States Patent
Hong

(10) Patent No.: US 7,095,663 B2
(45) Date of Patent: Aug. 22, 2006

(54) METHOD FOR ANALYZING DEFECT OF SRAM CELL

(75) Inventor: Yun Seok Hong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 109 days.

(21) Appl. No.: 10/966,081

(22) Filed: Oct. 15, 2004

(65) Prior Publication Data
US 2005/0111272 A1    May 26, 2005

(30) Foreign Application Priority Data
Nov. 21, 2003  (KR) ................. 10-2003-0082872

(51) Int. Cl.
G11C 7/00 (2006.01)
(52) U.S. Cl. ....................................... 365/201; 365/154
(58) Field of Classification Search ................. 365/201, 365/154, 156, 200
See application file for complete search history.

(56) References Cited

U.S. PATENT DOCUMENTS

| 5,361,232 A | * | 11/1994 | Petschauer et al. ......... 365/201 |
| 6,081,465 A | * | 6/2000 | Wang et al. ................ 365/201 |
| 6,392,941 B1 | * | 5/2002 | Churchill .................... 365/201 |
| 6,757,205 B1 | * | 6/2004 | Salters ........................ 365/201 |

* cited by examiner

*Primary Examiner*—Anh Phung
(74) *Attorney, Agent, or Firm*—Ladas & Parry LLP

(57) ABSTRACT

Disclosed is a method for analyzing a defect of a semiconductor device, and more particularly a method for electrically analyzing a defect of a transistor formed in a cell having a latch structure, such as SRAM or a sense amplifier of DRAM. The defect analyzing method according to the present invention comprises the steps of forming a test SRAM cell array in a scribe lane region of a wafer which is formed with a plurality of SRAM chips, forming a pad portion for testing the SRAM cell array on the scribe lane region, and applying a predetermined test voltage to the SRAM cell array through the pad portion. The respective array cells constituting the SRAM cell array are provide with two word lines, and individual test voltages can be applied through the pad portion to the two word lines, respectively.

11 Claims, 3 Drawing Sheets

METHOD FOR ANALYZING DEFECT OF SRAM CELL

BACKGROUND OF THE INVENTION

1. Field of the Invention

The present invention relates to a method for analyzing a defect of a semiconductor device, and more particularly to a method for electrically analyzing a defect for a pattern having a latch structure, such as SRAM or a sense amplifier of DRAM.

2. Description of the Prior Art

As generally known in the art, defect analysis for SRAM employs a physical measuring method such as SEM, TEM or the like, or a method in which a test pattern (it may not wholly correspond to a normal pattern) is prepared under the same design rule as that of a normal pattern and the test pattern is analyzed with respect to whether or not a short circuit or a bridge is generated.

However, since a normal pattern and a test pattern (e.g., an SRAM cell and a correspondent test cell) partially differ from each other, it is problematic to exactly find out whether or not the normal pattern the normal pattern is defective simply by defect analysis for the test pattern.

SUMMARY OF THE INVENTION

Accordingly, the present invention has been made to solve the above-mentioned problem occurring in the prior art, and an object of the present invention is to provide a defect analyzing method which can electrically find out a defect of a normal memory cell pattern and test whether or not a short circuit and a bridge is generated in a memory cell array by embodying the same test memory cell pattern as the normal memory cell pattern.

In order to accomplish this object, there is provided a method for analyzing a defect of a semiconductor device, the method comprising the steps of: forming a test SRAM cell array in a scribe lane region of a wafer which is formed with a plurality of SRAM chips; forming a pad portion for testing the SRAM cell array on the scribe lane region; and applying a predetermined test voltage to the SRAM cell array through the pad portion, wherein two switch transistors of the respective array cells constituting the SRAM cell array are connected to two word lines different from each other, and individual test voltages can be applied through the pad portion to the two word lines, respectively.

Also, the method for analyzing a defect of a semiconductor device in accordance with the present invention may perform an electrical test by forming a test pattern for the test in a scribe lane region, the test pattern being the same as a cell which has a latch structure formed in a cell region, and by applying a test voltage to the test pattern through a pad.

Here, since the test pattern is formed identically to an SRAM cell of the cell region including a first word line and a second word line, a first bit line and a second bit line, and a first transistor and a second transistor, whether or not the SRAM cell is defective can be checked by changing voltage levels applied to the first and second word lines and the first and second bit lines, and applied as a power source voltage and a ground voltage.

Also, since the test pattern is formed identically to a sense amplifier of the cell region, whether or not the sense amplifier is defective can be checked by changing a voltage level applied to the test pattern.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
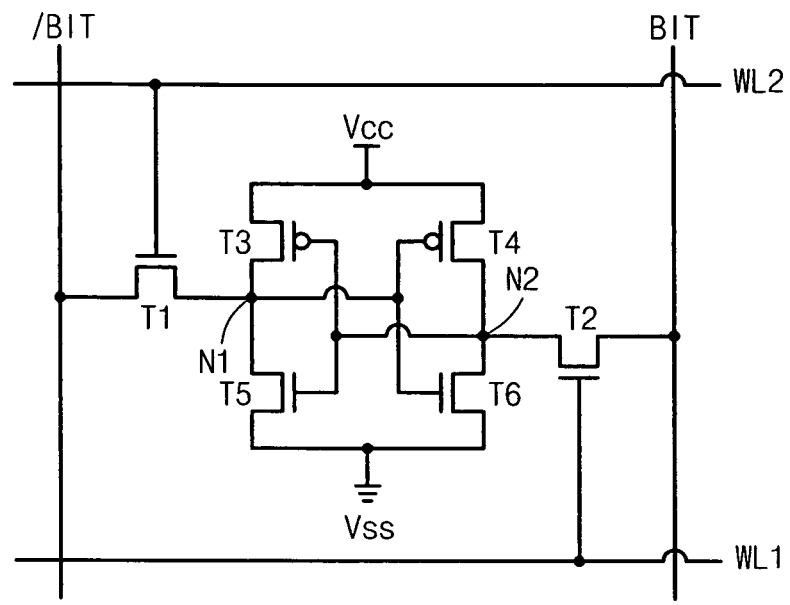
FIG. 1 is a circuit diagram of an SRAM cell for explaining a defect analyzing method of a semiconductor device in accordance with the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

A method for analyzing a defect of a semiconductor device in accordance with the present invention will be described herein with respect to a case in which the method is embodied for SRAM. However, the present invention is not limited to this case, but may be applied to a cell having a latch structure, such as a sense amplifier of DRAM.

FIG. 1 is a basic circuit diagram of an SRAM cell, which is intended to explain a method for analyzing a defect of SRAM in accordance with a preferred embodiment of the present invention.

A test SRAM cell includes a first word line and a second word line WL2, WL1, a first bit line and a second bit line /BIT, BIT, a first transistor and a second transistor for performing a switching function T1, T2, and a first inverter T3, T5 and a second inverter T4, T6 connected in parallel to each other between a power source voltage and a ground voltage.

Here, a gate of the first transistor is connected to the first word line, a gate of the second transistor is connected to the second word line, one terminal of the first transistor is connected to the first bit line, the other terminal of the first transistor is connected in common to an output terminal of the first inverter and an input terminal of the second inverter, one terminal of the second transistor is connected to the second bit line, and the other terminal of the second transistor is connected in common to an output terminal of the second inverter and an input terminal of the first inverter.

According to the present invention, whether or not the SRAM cell is defective is checked by changing voltage levels applied to the first and second word lines and the first and second bit lines, and applied as the power source voltage and the ground voltage.

For reference, the cell having the above-mentioned structure differs from a general cell structure in that the gate of the first transistor T1 is connected to the first word line WL2 and the gate of the second transistor T2 is connected to the second word line WL1 for the purpose of testing a defect of the cell. Herein, "BIT" and "/BIT" designate bit lines and "WL1" and "WL2" designate word lines. In addition, "VCC" and "VSS" designate a power source voltage for driving a latch-type memory cell and a ground voltage, respectively. A more detailed description will be given below.

A circuit shown in FIG. 1 is a test circuit formed on a scribe lane of a wafer and such a cell array was built up to 8K in the present test. In contrast with a general memory cell, two word lines WL1, WL2 were provided for one cell to enable switch components to be individually turned on/off, which corresponds to line arrangement for a defect analyzing test.

Defect analysis for the cell in FIG. 1 was conducted under conditions listed below in Table 1.

For reference, separate pads for applying voltages to the bit lines and the word lines, and applying the power source voltage and the ground voltage were provided in FIG. 1 and Table 1.

a specific level to the first word line, the first bit line and the second bit line, and connecting the second word line and a bias voltage of a well, in which the cell is located, to the ground voltage.

Example 2 represents a method for checking a defect of the cell by applying a high voltage at a specific level to the second word line, the first bit line and the second bit line, and connecting the first word line and a bias voltage of a well, in which the cell is located, to the ground voltage.

Example 3 represents a method for checking a defect of the cell by applying a high voltage at a specific level to the second bit line after the first and second word lines have been boosted from the ground voltage level to a specific high voltage level, and connecting the first bit line and a bias voltage of a well, in which the cell is located, to the ground voltage.

Example 4 represents a method for checking a defect of the cell by applying a high voltage at a specific level to the first bit line after the first and second word lines have been boosted from the ground voltage level to a specific high voltage level, and connecting the second bit line and a bias voltage of a well, in which the cell is located, to the ground voltage.

TABLE 1

| | | | | | |
|---|---|---|---|---|---|
| Fixing word lines at specific voltage level (sampling mode) | Applying high level to node N1 and applying low level to node N2: Example 1 | Applying 5.7 V as power source voltage VCC | Applying 5.7 V to each of bit line BIT and word line WL1 | Applying 5.7 V to bit line/ BIT | Applying 0 V to ground voltage, well voltage and word line WL2 |
| | Applying low level to node N1 and applying high level to node N2: Example 2 | Applying 5.7 V as power source voltage VCC | Applying 5.7 V to each of bit line BIT and word line WL2 | Applying 5.7 V to bit line BIT | Applying 0 V to ground voltage, well voltage and word line WL1 |
| Slowly raising voltage of word line or bit line (sweep mode) | Applying low level to node N1 and applying high level to node N2: Example 3 | Boosting word lines WL1, WL2 from 0 V to 5.7 V | Placing power source voltage as 5.7 V | Applying 5.7 V to bit line BIT | Applying 0 V to ground voltage, well voltage and bit line/ BIT |
| | Applying high level to node N1 and applying low level to node N2: Example 4 | Boosting word lines WL1, WL2 from 0 V to 5.7 V | Placing power source voltage as 5.7 V | Applying 5.7 V to bit line/ BIT | Applying 0 V to ground voltage, well voltage and bit line BIT |
| | Sweeping bit line BIT: Example 5 | Boosting bit line BIT from 0 V to 5.7 V | Placing power source voltage as 5.7 V | Applying 5.7 V to bit line/ BIT | Applying 0 V to ground voltage, well voltage and word lines WL1, WL2 |
| | Sweeping bit line/BIT: Example 6 | Boosting bit line/ BIT from 0 V to 5.7 V | Placing power source voltage as 5.7 V | Applying 5.7 V to bit line BIT | Applying 0 V to ground voltage, well voltage and word lines WL1, WL2 |

Referring to Table 1, Example 1 represents a method for checking a defect of the cell by applying a high voltage at Example 5 represents a method for checking a defect of the cell by applying a high voltage at a specific level to the first bit line after the second bit line has been boosted from the ground voltage level to a specific high voltage level, and connecting the first and second word lines and a bias voltage of a well, in which the cell is located, to the ground voltage.

Example 6 represents a method for checking a defect of the cell by applying a high voltage at a specific level to the second bit line after the first bit line has been boosted from the ground voltage level to a specific high voltage level, and connecting the first and second word lines and a bias voltage of a well, in which the cell is located, to the ground voltage.

As a result of measurements according to the measuring methods represented in Table 1, for example, as a result of measurements according to Examples 1 and 2, it may be estimated that there is a short circuit between a node N1 and the bit line /BIT or a short circuit between the node N1 and the ground voltage in FIG. 1 when a leakage current to the bit line has been measured. It is also possible to estimate that there is a short circuit between a node N2 and the bit line /BIT or a short circuit between the node N2 and the ground voltage.

Figure 3:
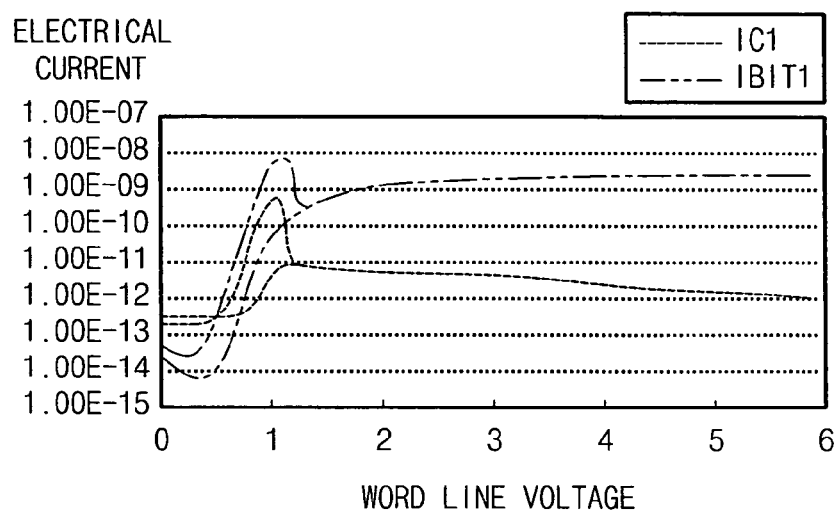
FIG. 3 is a graph showing an electrical current in a case where there is a defect as a result of a test according to examples 3 and 4.

In this case, if the leakage current has a difference before and after turning-on of the word line in a retest under the conditions as those of Examples 3 and 4, it can be seen that there is a short circuit between the node N1 or N2 and the ground voltage (See FIG. 3).

In a case where a leakage current occurs as a result of tests according to Examples 1 and 2, it may be estimated that there is a short circuit between the node and the bit line if tests according to Examples 3 and 4 exhibits no leakage current and tests according to Examples 5 and 6 exhibits the occurrence of a leakage current.

Figure 2:
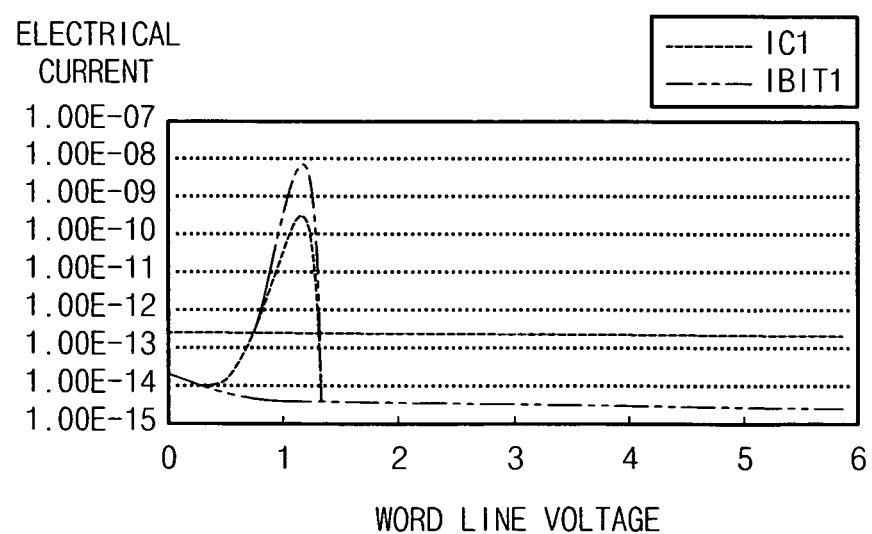
FIG. 2 is a graph showing an electrical current in a case where there is no defect as a result of a test according to examples 3 and 4.

FIG. 2 is a graph showing an electrical current in a case where there is no defect as a result of a test according to examples 3 and 4, and FIG. 3 is a graph showing an electrical current in a case where there is a defect as a result of a test according to examples 3 and 4. In a case where there is a defect, the leakage flows more than in FIG. 2 as seen from FIG. 3.

Figure 4:
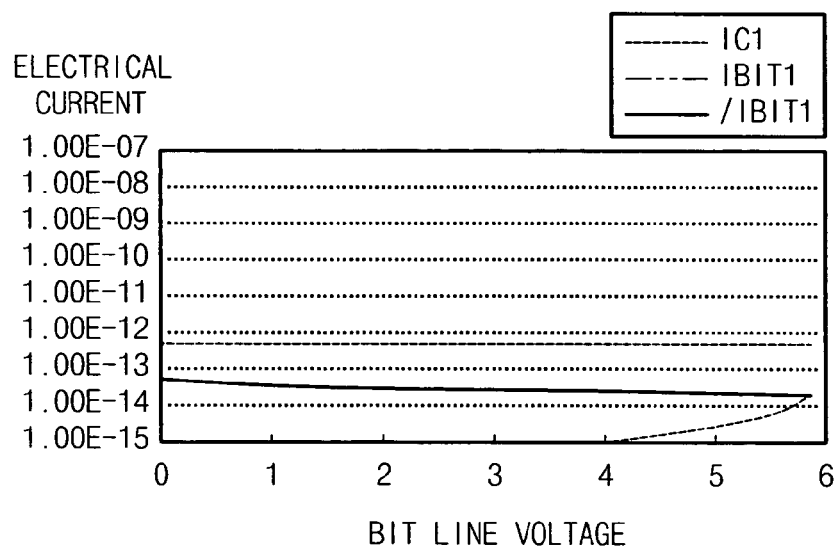
FIG. 4 is a graph showing an electrical current in a case where there is no defect as a result of a test according to examples 5 and 6.
Figure 5:
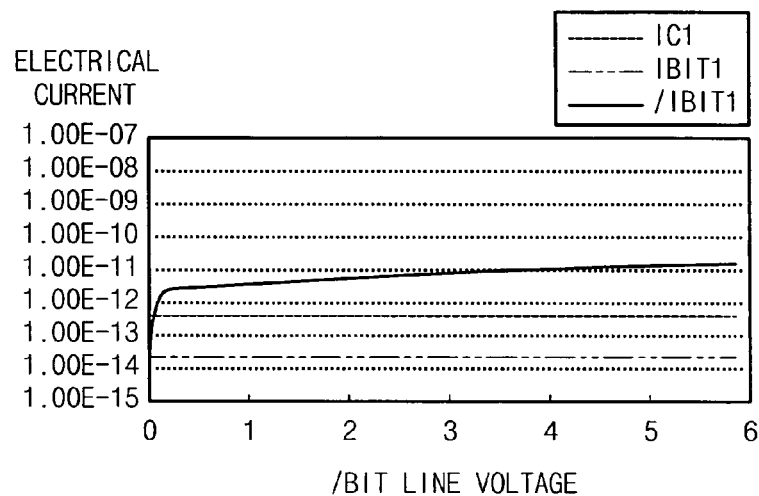
FIG. 5 is a graph showing an electrical current in a case where there is a defect as a result of a test according to examples 5 and 6.

FIG. 4 is a graph showing an electrical current in a case where there is no defect as a result of a test according to examples 5 and 6, and FIG. 5 is a graph showing an electrical current in a case where there is a defect as a result of a test according to examples 5 and 6. In a case where there is a defect, the leakage flows more than in FIG. 4 as seen from FIG. 5.

Figure 6:
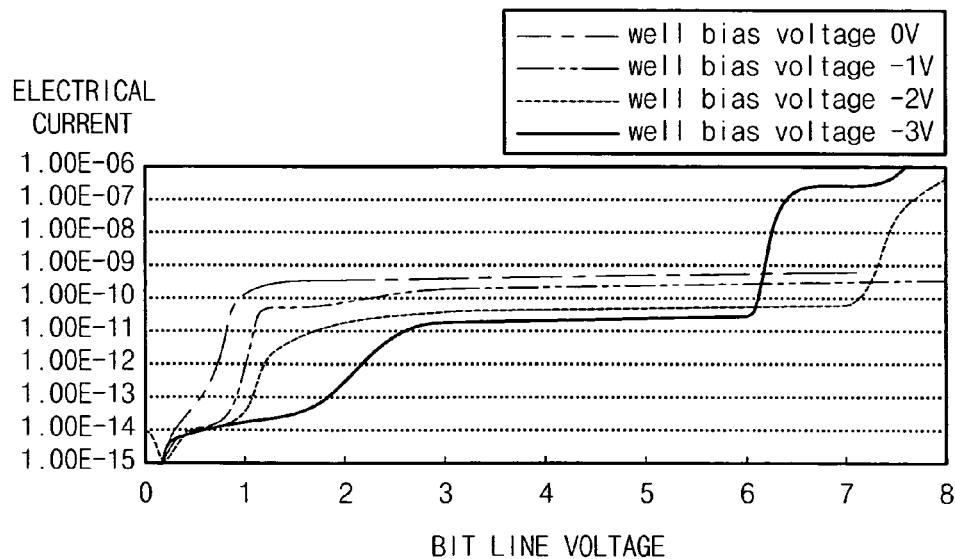
FIG. 6 is a graph showing a result of an operation for examining what causes a leakage current in FIG. 3 or FIG. 5.

FIG. 6 is a graph showing a result of an operation for examining what causes a leakage current in FIG. 3 or FIG. 5.

In FIG. 6, change in an electrical current flowing in a transistor which has a defect as in FIGS. 3 and 5 was measured while a voltage of a well formed with the memory cell varies. In the present test, the bias voltages of a well was applied as 0 V, −1 V, −2 V and −3 V, respectively, and the amount of change in an electrical current flowing in the relevant transistor which is estimated to have a defect was measured.

As seen from the test result, the leakage current is decreased as the bias voltage of a well varies toward a lower negative voltage. It can be inferred from this test result that a defect in a cell transistor is caused by a dislocation which may be generated during the formation of a memory cell. Since the test shows that the leakage current changes when the bias voltage of a well in which the cell located varies, the above-mentioned inferential result (that is, the result saying that a defect is caused by a dislocation) is regarded as appropriate.

The present invention has been described above on the subject of SRAM, but it should not be limited to this. Besides SRAM, electrical defect analysis may be performed by preparing a pattern having a latch structure, such as a sense amplifier of DRAM, and changing a voltage level applied to a test pattern, so that manufacturers understanding the technical sprits of the present invention can diversely embody the present invention.

As seen from the above description, a defect analyzing method in accordance with the present invention is very effective in readily analyzing a defect of a transistor constituting each memory cell, a cause of the defect and a solution to the defect.

In other words, when the defect analyzing method of an SRAM cell in accordance with the present invention is employed, a dislocation of a memory cell transistor can be detected and a leakage current due to the dislocation can be controlled by adjusting a bias voltage of a well.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for analyzing a defect of an SRAM cell, the method comprising the steps of:
    forming a test SRAM cell array in a scribe lane region of a wafer which is formed with a plurality of SRAM chips;
    forming a pad portion for testing the SRAM cell array on the scribe lane region; and
    applying a predetermined test voltage to the SRAM cell array through the pad portion,
wherein two switch transistors of the respective array cells constituting the SRAM cell array are connected to two word lines different from each other, and individual test voltages can be applied through the pad portion to the two word lines, respectively.

2. The method as claimed in claim 1, wherein a test pattern comprises:
    a first word line and a second word line;
    a first bit line and a second bit line;
    a first transistor and a second transistor for performing a switching function; and
    a first inverter and a second inverter connected in parallel to each other between a power source voltage and a ground voltage,
wherein a gate of the first transistor is connected to the first word line, a gate of the second transistor is connected to the second word line, one terminal of the first transistor is connected to the first bit line, the other terminal of the first transistor is connected in common to an output terminal of the first inverter and an input terminal of the second inverter, one terminal of the second transistor is connected to the second bit line, and the other terminal of the second transistor is connected in common to an output terminal of the second inverter and an input terminal of the first inverter, and
wherein whether or not the SRAM cell is defective is checked by changing voltage levels applied to the first and second word lines and the first and second bit lines, and applied as the power source voltage and the ground voltage.

3. The method as claimed in claim 2, wherein whether or not the cell is defective is checked by applying a high voltage at a specific level to the first word line, the first bit line and the second bit line, and connecting the second word line and a bias voltage of a well, in which the cell is located, to the ground voltage.

4. The method as claimed in claim 2, wherein whether or not the cell is defective is checked by applying a high voltage at a specific level to the second word line, the first bit line and the second bit line, and connecting the first word line and a bias voltage of a well, in which the cell is located, to the ground voltage.

5. The method as claimed in claim 2, wherein whether or not the cell is defective is checked by applying a high voltage at a specific level to the second bit line after the first and second word lines have been boosted from the ground voltage level to a specific high voltage level, and connecting the first bit line and a bias voltage of a well, in which the cell is located, to the ground voltage.

6. The method as claimed in claim 2, wherein whether or not the cell is defective is checked by applying a high voltage at a specific level to the first bit line after the first and second word lines have been boosted from the ground voltage level to a specific high voltage level, and connecting the second bit line and a bias voltage of a well, in which the cell is located, to the ground voltage.

7. The method as claimed in claim 2, wherein whether or not the cell is defective is checked by applying a high voltage at a specific level to the first bit line after the second bit line has been boosted from the ground voltage level to a specific high voltage level, and connecting the first and second word lines and a bias voltage of a well, in which the cell is located, to the ground voltage.

8. The method as claimed in claim 2, wherein whether or not the cell is defective is checked by applying a high voltage at a specific level to the second bit line after the first bit line has been boosted from the ground voltage level to a specific high voltage level, and connecting the first and second word lines and a bias voltage of a well, in which the cell is located, to the ground voltage.

9. A method for analyzing a defect of an SRAM cell, the method comprising the steps of:

forming a test pattern for the test in a scribe lane region, the test pattern being the same as a cell which has a latch structure formed in a cell region; and applying a test voltage to the test pattern through a pad, thereby performing an electrical test.

10. The method as claimed in claim 9, wherein whether or not the cell is defective is checked by forming the test pattern identically to an SRAM cell of the cell region including a first word line and a second word line, a first bit line and a second bit line, and a first transistor and a second transistor, and by changing voltage levels applied to the first and second word lines and the first and second bit lines, and applied as a power source voltage and a ground voltage.

11. The method as claimed in claim 9, wherein whether or not the cell is defective is checked by forming the test pattern identically to a sense amplifier of the cell region, and by changing a voltage level applied to the test pattern.

* * * * *